United States Patent [19]

Hoshi

[11] Patent Number: 4,785,206

[45] Date of Patent: Nov. 15, 1988

[54] SIGNAL INPUT CIRCUIT UTILIZING FLIP-FLOP CIRCUIT

[75] Inventor: Katsuji Hoshi, Tokyo, Japan

[73] Assignee: NEC Corporation, Tokyo, Japan

[21] Appl. No.: 882,563

[22] Filed: Jul. 7, 1986

[30] Foreign Application Priority Data

Jul. 5, 1985 [JP] Japan .................. 60-148639

[51] Int. Cl.[4] ................. H03K 3/356; H03K 3/013; H03K 17/04; H03K 19/01
[52] U.S. Cl. ................. 307/530; 307/279; 307/291; 365/203; 365/205
[58] Field of Search ............ 307/247 R, 279, 272 A, 307/281, 282, 304, 446, 448, 530; 365/205, 189, 203

[56] References Cited

U.S. PATENT DOCUMENTS

| 4,396,845 | 8/1983 | Nakano | 365/205 |
|---|---|---|---|
| 4,417,163 | 11/1983 | Otsuki et al. | 365/203 |
| 4,442,365 | 4/1984 | Nagami et al. | 307/291 |
| 4,458,337 | 7/1984 | Takemae et al. | 365/189 |
| 4,542,306 | 9/1985 | Ikeda et al. | 307/272 |

Primary Examiner—John S. Heyman
Assistant Examiner—Tai V. Duong
Attorney, Agent, or Firm—Sughrue, Mion, Zinn, Macpeak and Seas

[57] ABSTRACT

A signal input circuit of a type in which an input signal voltage is compared with a reference voltage is disclosed. The input signal voltage is supplied to a first transistor coupled between a first input terminal of a flip-flop circuit and a reference terminal, and the reference voltage is supplied to a second transistor coupled between a second input terminal of the flip-flop circuit and the reference terminal. A first gate is inserted in series to the first transistor between the first input terminal and the reference terminal, and a second gate is inserted in series to the second transistor between the second input terminal and the reference terminal. The first and second gates are controlled by potentials at the second and first output terminals, respectively.

5 Claims, 5 Drawing Sheets

SIGNAL INPUT CIRCUIT UTILIZING FLIP-FLOP CIRCUIT

BACKGROUND OF THE INVENTION

The present invention relates to a signal input circuit, and more particularly to an input circuit of a type in which an input signal is compared with a reference voltage to detect a logic level of the input signal.

A signal input circuit of this type is widely employed in, for example, a semiconductor memory as an address input circuit and a data input circuit. It comprises a flip-flop circuit, a first transistor supplied with an input signal and connected between a first input terminal of the flip-flop circuit and a reference terminal, and a second transistor supplied with the reference voltage and connected between a second input terminal of the flip-flop circuit and the reference terminal.

When the level of the input signal is larger than the reference voltage, the first transistor takes an internal resistance smaller than the second transistor, so that the first input terminal takes the low level. When the input signal takes the low level or a level that is smaller than the reference voltage, the first transistor is turned OFF or has a high internal resistance. As a result, the second input terminal takes the low level. The second transistor is in the conductive state regardless of whether or not the level of the input signal is larger than the reference voltage, and therefore a d.c. current flows between power supply terminals through the second transistor and an internal load of the flip-flop circuit. The power consumption is thereby increased. Moreover, the potential at the second input terminal is determined by the resistance ratio between the second transistor and the internal load of the flip-flop circuit when the input signal takes the level higher than the reference voltage. In other words, the second input terminal assumes an intermediate level between the high level and the low level. For this reason, the potential difference between the first and second input terminals is not amplified sufficiently only by an output amplifier, so that another flip-flop circuit is required to produce and hold the high level and low level output signals. The circuit construction is thereby made complicated. Furthermore, if the level of the input signal varies after one of the first and second input terminals takes the low level, the potentials at the other input terminal is changed. In order to avoid this defect, the signal input circuit further includes first and second gates. The input signal is supplied through the first gate to the first transistor, and the reference voltage is supplied via the second gate to the second transistor. The first and second gates are opened by a clock signal only during a predetermined time period. This means that the circuit construction is further made complicated.

SUMMARY OF THE INVENTION

Therefore, an object of the present invention is to provide a signal input circuit in which the power consumption is reduced.

Another object of the present invention is to provide a signal input circuit having a simplified circuit construction.

A signal input circuit according to the present invention comprises a flip-flop circuit including first and second input terminals, a reference terminal, a first transistor and a first gate connected in series between the first input terminal of the flip-flop circuit and the reference terminal, a second transistor and a second gate connected in series between the second input terminal of the flip-flop circuit and the reference terminal, means for supplying an input signal to a control electrode of the first transistor, means for supplying a reference voltage to a control electrode of the second transistor, means for supplying a potential relative to a level at the second input terminal to a control terminal of the first gate, and means for supplying a potential relative to a level at the first input terminal to a control terminal of the second gate.

When the input signal takes a level higher than the reference voltage, the first input terminal takes the low level, so that the second gate is closed. Therefore, a d.c current does not flow through the second transistor. Moreover, the closed state of the second gate prevents the lowering of the potential at the second input terminal and further does not change the potential at the second input terminal even when the input signal drops to a level lower than the reference voltage.

When the level of the input signal is lower than the reference voltage, the second input terminal takes the low level, so that the first gate is closed. The closed state of the first gate prevents the potential change at the first input terminal even if the input signal is raised to a level higher than the reference voltage.

BRIEF DESCRIPTION OF THE DRAWINGS

The above and other objects, advantages and features of the present invention will be more apparent from the following description taken in conjunction with the accompanying drawings, in which.

Figure 1:
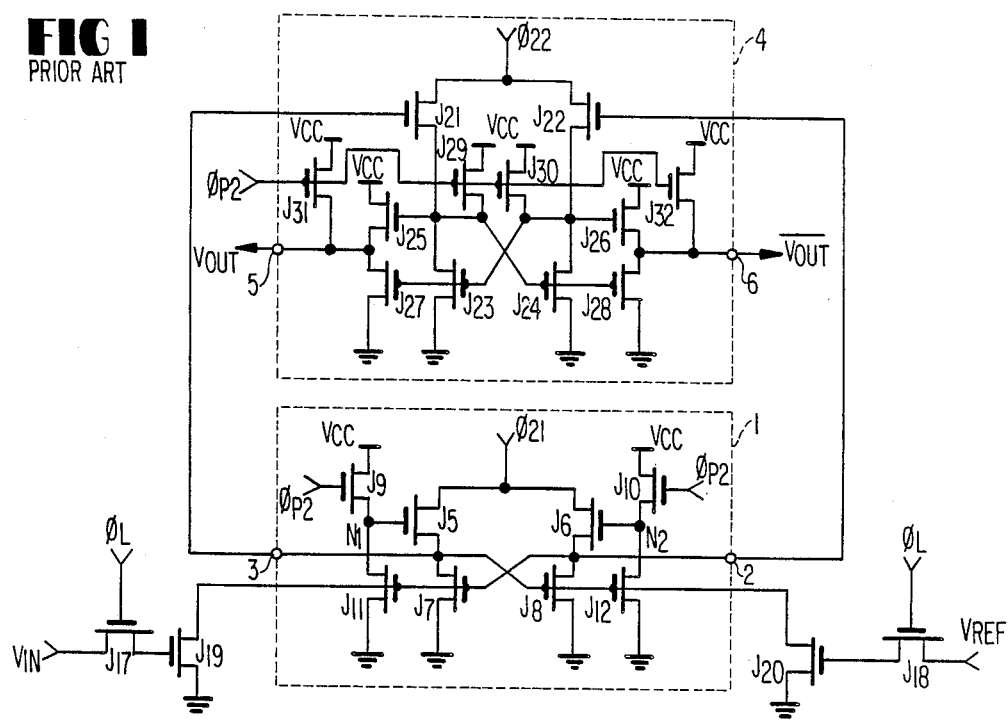
FIG. 1 is a circuit diagram showing prior art.

Incidentally, all the transistors shown in the drawings are N-channel insulated gate field effect transistors, but P-channel insulated gate field effect transistors or bipolar transistors of NPN type or PNP type may be employed.

DETAILED DESCRIPTION OF THE PRIOR ART

A signal input circuit according to prior art is shown in FIG. 1 in order to facilitate the understanding of the present invention. An input signal voltage $V_{IN}$ is supplied via a transistor $J_{17}$ to a transistor $J_{19}$, and a reference voltage $V_{ref}$ is supplied through a transistor $J_{18}$ to a transistor $J_{20}$. The transistor $J_{19}$ is connected between a first input (output) terminal 2 of a flip-flop circuit 1, and the transistor $J_{20}$ is connected between a second input (output) terminal 3 of the flip-flop circuit 1. The flip-flop circuit 1 includes eight transistors $J_5$ to $J_{12}$, and the outputs thereof are supplied to an output amplifier 4.

In an initial state, the transistors $J_9$ and $J_{10}$ are turned ON by a precharge signal $\phi_{P2}$ to precharge nodes $N_1$ and $N_2$ to the high level. The transistors $J_5$ and $J_6$ are thereby turned ON, but at this time, a first activating signal $\phi_{21}$ is in the low level, and therefore the input terminals 2 and 3 take the low level. After the precharge signal $\phi_{P2}$ changes to the low level, the activating signal $\phi_{21}$ changes to the high level, so that the transistors $J_5$ and $J_6$ intend to raise the potentials at the input terminals 3 and 2, respectively. At this time, when the internal resistance of the transistor $J_{19}$ is smaller than that of $J_{20}$ due to the fact that the input signal voltage $V_{IN}$ is higher than the reference voltage $V_{ref}$, the potential raising rate at the second input terminal 3 is faster than that at the input terminal 2. That is, the potential difference occurs between the input terminals 2 and 3. This potential difference is amplified and the result is fed back to the input terminals 2 and 3 by the transistors $J_7$ and $J_8$ and back to the nodes $N_1$ and $N_2$ by the transistors $J_{11}$ and $J_{12}$. As a result, the transistors $J_6$, $J_7$ and $J_{11}$ are turned OFF and the transistors $J_8$ and $J_{12}$ are turned ON. The first input terminal 2 thereby takes the low level. When the input signal voltage $V_{IN}$ is smaller than the reference voltage, the transistors $J_5$, $J_8$ and $J_{12}$ are turned OFF and the transistors $J_7$ and $J_{11}$ are turned ON. Therefore, the second input terminal 3 takes the low level.

However, the transistor $J_{20}$ is in the conductive state by the reference voltage $V_{ref}$ regardless of the level of the input signal $V_{IN}$. In addition, the transistors $J_5$ is in the conductive state when the input signal voltage $V_{IN}$ is higher than the reference voltage $V_{ref}$. For this reason, a d.c. current flows through the transistors $J_5$ and $J_{20}$ to cause large power consumption. Moreover, the potential at the input terminal 3 is determined by the internal resistances of the transistors $J_5$ and $J_{20}$ and thus takes an intermediate level between the high level and the low level. The potential difference between the input terminals 2 and 3 is amplified by an output amplifier 4. However, if the output amplifier 4 is not provided with a flip-flop circuit including transistors $J_{23}$ to $J_{28}$, a differential amplifier composed of transistors $J_{21}$ and $J_{22}$ cannot raise an output signal $V_{OUT}$ to the high level due to the fact that the potential at the gate of the transistor $J_{21}$ is relatively low. Therefore, the output amplifier 4 further includes the flip-flop circuit composed of the transistors $J_{23}$ to $J_{28}$ to produce the high level output $V_{OUT}$ at a first signal output terminal 5 and the low level output $\overline{V_{OUT}}$ at a second signal output terminal 6. The transistors $J_{29}$ to $J_{30}$ are precharge transistors responsive to the precharge signal $\phi_{P2}$. The output amplifier 4 is activated by a second activating signal $\phi_{22}$.

The input signal voltage $V_{IN}$ often varies after the first activating signal $\phi_{21}$ changes to the high level. If the input signal voltage $V_{IN}$ varies from the low level to a level that is higher than the reference voltage $V_{ref}$, the transistor $J_{19}$ is turned ON to lower the potential at the terminal 2, so that the output signals $V_{OUT}$ and $\overline{V_{OUT}}$ change their levels. In order to overcome this defect, the transistors $J_{17}$ and $J_{18}$ are provided and driven by a latch clock signal $\phi_L$. The input signal voltage $V_{IN}$ and the reference voltage $V_{ref}$ are supplied respectively to the transistors $J_{19}$ and $J_{20}$ only when the latch signal $\phi_L$ takes the high level.

As described above, the signal input circuit shown in FIG. 1 consumes a large power and has a complicated circuit construction.

DETAILED DESCRIPTION OF THE INVENTION

Figure 2:
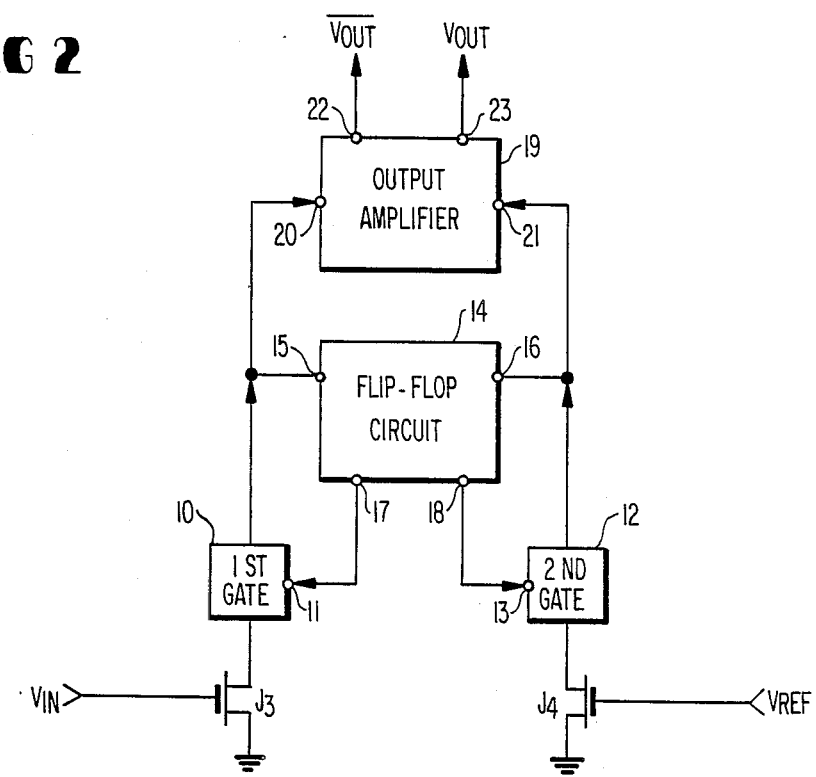
FIG. 2 is a block diagram showing an embodiment of the present invention.

An embodiment of the present invention is shown in FIG. 2 as a block form. A transistor $J_3$ and a first gate 10 are connected in series between a first input (output) terminal 15 of a flip-flop circuit 14 and a reference terminal (the ground terminal in this embodiment). An input voltage $V_{IN}$ is supplied to a control electrode (i.e., a gate electrode) of the transistor $J_3$. A transistor $J_4$ and a second gate 12 are connected in series between a second input (output) terminal 16 of the flip-flop circuit 14. The transistor $J_4$ is supplied with a reference voltage $V_{ref}$ at its control (gate) electrode. The flip-flop circuit 14 produces at a terminal 17 a potential relative to the potential at the second input terminal 16, which is in turn supplied to a control terminal 11 of the first gate 10. The flip-flop circuit 14 further produces at a terminal 18 a potential relative to the potential at the first input terminal 15. The potential at the terminal 18 is supplied to a control terminal 13 of the second gate 12. The terminals 15 and 16 of the flip-flop circuit 14 are connected to input terminals 20 and 21 of an output amplifier 19, respectively, so that an output signal $V_{OUT}$ and an inverted output signal $\overline{V_{OUT}}$ are derived from signal output terminals 23 and 22, respectively.

In an initial state, the first and second gates 10 and 12 are opened. Therefore, the difference in internal resistance between the transistors $J_3$ and $J_4$ caused by the level difference between the input signal voltage $V_{IN}$ and the reference voltage $V_{ref}$ is transferred between the input terminals 15 and 16. One of the terminals 15 and 16 thereby takes the low level. When the terminal 15 takes the low level, the second gate 12 is closed by the potential at the terminal 18. Accordingly, a d.c. current does not flow through the transistor $J_4$, and further the lowering of the potential at the output terminal 16 does not occur. The output amplifier 20 thus produces the high level output $V_{OUT}$ without another flip-flop circuit. When the second output terminal 16 takes the low level, the first gate 10 is closed. Therefore, the change in potential at the first input terminal 16 does not occur even when the input signal voltage $V_{IN}$ varies.

Figure 3:
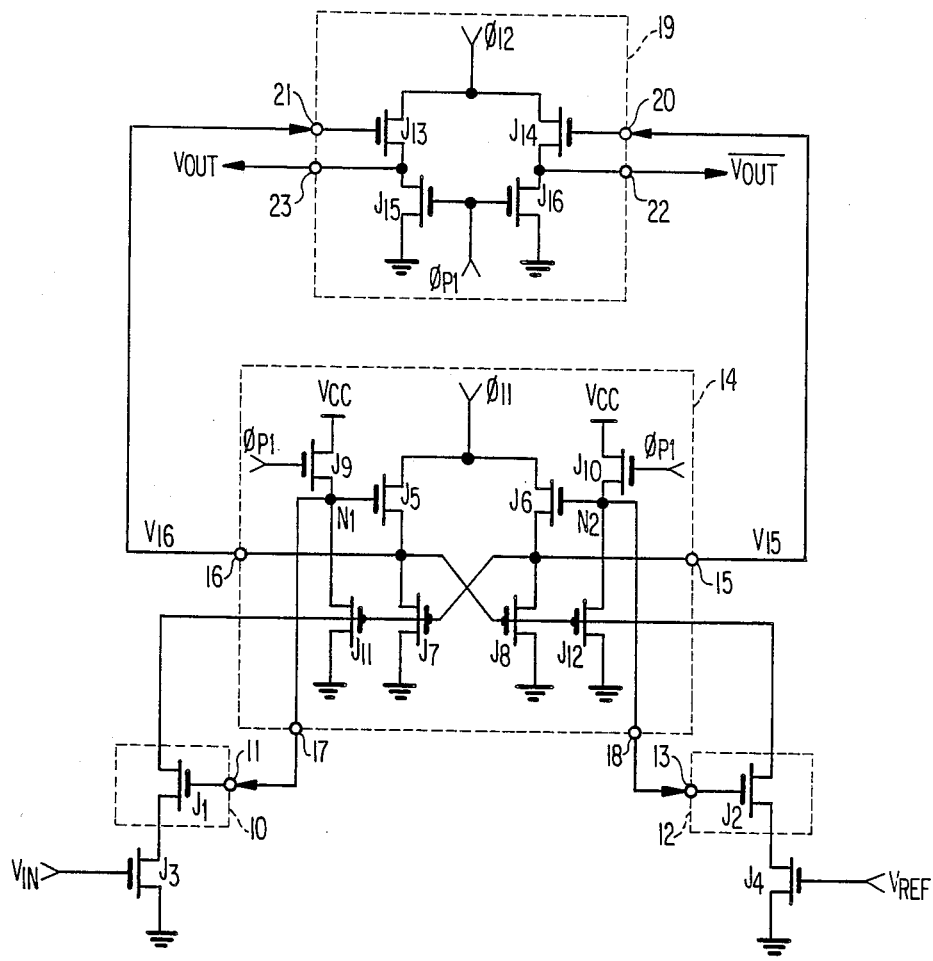
FIG. 3 is a circuit diagram representing in detail a circuit construction of FIG. 2.

The above features and advantages will be described in detail with reference to the circuit diagram shown in FIG. 3. In FIG. 3, the same constituents as those shown in FIG. 2 are denoted by the same references and symbols to omit their further description.

The first and second gates 10 and 12 are composed respectively of transistors $J_1$ and $J_2$ whose gate electrodes are connected respectively to the control terminals 11 and 13. The flip-flop circuit 14 includes eight transistors $J_5$ and $J_{12}$. The transistors $J_9$ and $J_{11}$ are connected in series between power supply terminals (Vcc and GND). The transistors $J_{10}$ and $J_{12}$ are also connected in series between the power supply terminals. The transistors $J_9$ and $J_{10}$ are supplied with a precharge signal $\phi_{P1}$. The connection point $N_1$ of the transistors $J_9$ and $J_{11}$ and that $N_2$ of the transistors $J_{10}$ and $J_{12}$ are connected respectively to the control terminals 11 and 13 of the gates 10 and 12 through the terminals 17 and 18. The transistors $J_5$ and $J_7$ and those $J_6$ and $J_8$ are connected in series, respectively, between a first activating signal ($\phi_{11}$) supply terminal and GND. The connection point of $J_5$ and $J_7$ is connected to the second input terminal 16 and further to the gate electrodes of the transistors $J_8$ and $J_{12}$. The connection point of $J_6$ and $J_8$ is connected to the first input terminal 15 and further to the gate electrodes of $J_7$ and $J_{11}$. The nodes $N_1$ and $N_2$ are also connected respectively to the gate electrodes of $J_5$ and $J_6$. The output amplifier 19 includes four transistors $J_{13}$ to $J_{16}$. The transistors $J_{13}$ and $J_{15}$ and those $J_{14}$ and $J_{16}$ are connected in series, respectively, and a second activating signal $\phi_{12}$ is supplied to these series connection circuits. The gate electrodes of $J_{13}$ and $J_{14}$ are connected respectively to the input terminals 21 and 20. The connection point of $J_{13}$ and $J_{15}$ and that of $J_{14}$ and $J_{16}$ are connected respectively to the signal output terminals 23 and 22. The transistors $J_{15}$ and $J_{16}$ are supplied with the precharge signal $\phi_{P1}$ at their gate electrodes.

Figure 4:
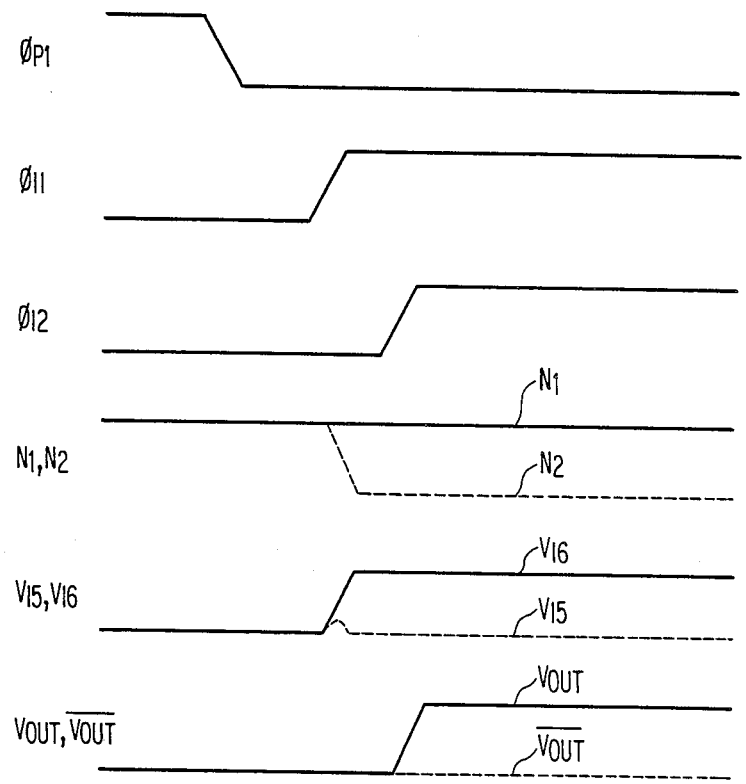
FIG. 4 is a timing chart for explaining an operation of the circuit shown in FIG. 3.

FIG. 4 shows a timing chart for explaining an operation of the circuit shown in FIG. 3. In an initial state, the precharge signal $\phi_{P1}$ takes the high level to turn the transistors $J_9$, $J_{10}$, $J_{15}$ and $J_{16}$ ON. The nodes $N_1$ and $N_2$ are thereby charged to the high level and the output signals $V_{OUT}$ and $\overline{V_{OUT}}$ take the low level. Since the nodes $N_1$ and $N_2$ take the high level, the transistors $J_5$ and $J_6$ are turned ON, but at this time the first activating signal $\phi_{11}$ is in the low level, so that the potentials at the first and second input terminals 15 and 16 ($V_{15}$, $V_{16}$) take the low level. The high level at the nodes $N_1$ and $N_2$ turns the transistors $J_1$ and $J_2$ ON. The first and second gates 10 and 12 are thus in the opened state.

After the precharge signal $\phi_{P1}$ changes to the low level to turn the transistors $J_9$ and $J_{10}$ OFF, the first activating signal $\phi_{11}$ is inverted to the high level. Therefore, the transistors $J_5$ and $J_6$ intend to raise the potentials at the terminals 15 and 16. Assuming that the input signal voltage $V_{IN}$ is higher than the reference voltage $V_{ref}$, the transistor $J_3$ has its internal resistance smaller than the transistor $J_4$. Therefore, the raising rate of potential at the second input terminal 16 is higher that that at the first input terminal $V_{15}$ to produce the difference in potential between the terminals 15 and 16 as shown by $V_{15}$ and $V_{16}$ in FIG. 4. This potential difference is amplified and fed back to the input terminals 15 and 16 by the transistors $J_8$ and $J_7$. The potential $V_{15}$ at the first input terminal 15 thereby takes the low level, and the potential $V_{16}$ at the second input terminal 16 takes near the high level. The potential difference between the terminals 15 and 16 is also amplified and fed back to the nodes $N_1$ and $N_2$ by the transistors $J_{11}$ and $J_{12}$. The potential at the node $N_2$ is thereby inverted to the low level, and the potential at the node $N_1$ is held at the high level. The low level at the node $N_2$ turns the transistor $J_2$ OFF.

Thus, when the input voltage $V_{IN}$ is higher than the reference voltage $V_{ref}$, the transistors $J_2$, $J_6$, $J_7$, $J_9$, $J_{10}$ and $J_{11}$ are in the OFF-state and the transistors $J_1$, $J_5$, $J_8$ and $J_{12}$ are in the ON-state. Accordingly, no d.c. current path is formed. The power consumption is thereby reduced. Moreover, the OFF-state of the transistor $J_2$ prevents the lowering of the potential $V_{16}$ at the second input terminal 16 regardless of the conductive state of the transistor $J_4$. The potential $V_{16}$ holds near the high level. Accordingly, the transistor $J_{13}$ in the output amplifier 19 responds to the high level activating signal $\phi_{12}$ and raises the output signal $V_{OUT}$ near the high level without another flip-flop circuit which would be required in the prior art circuit. The transistors $J_{15}$ and $J_{16}$ are in the OFF-state by the low level precharge signal $\phi_{P1}$ and the transistor $J_{14}$ is also in the OFF-state by the low level output $V_{15}$. Therefore, the inverted output signal $\overline{V_{OUT}}$ holds the low level.

Since the transistors $J_2$, $J_7$ and $J_{11}$ are in the OFF-state, substantial change of the potential $V_{16}$ does not occur even when the input voltage $V_{IN}$ goes to a level that is smaller than the reference voltage $V_{ref}$.

Assuming that the input signal voltage $V_{IN}$ is lower than the reference voltage $V_{ref}$ when the first activating signal $\phi_{11}$ change to the high level, the raising rate of the potential $V_{15}$ is higher that that of the potential $V_{16}$, so that the transistors $J_7$ and $J_{11}$ are turned ON to change the potentials at the node $N_1$ and terminal 16 to the low level. The transistor $J_1$ is thereby turned OFF to close the first gate 10. The output signal $V_{OUT}$ is held at the low level and the inverted output signal $\overline{V_{OUT}}$ is changed to the high level. Since the transistor $J_1$ is in the OFF-state, any potential changes does not occur in the flip-flop circuit 14 even when the input signal voltage increases to a level that is higher than the reference voltage.

As described above, the signal input circuit shown in FIG. 3 reduces power consumption and has a simplified circuit construction. Moreover, since the latch clock signal $\phi_L$ (see FIG. 1) is not required, the circuit construction is further simplified and an operation speed is increased.

Figure 5:
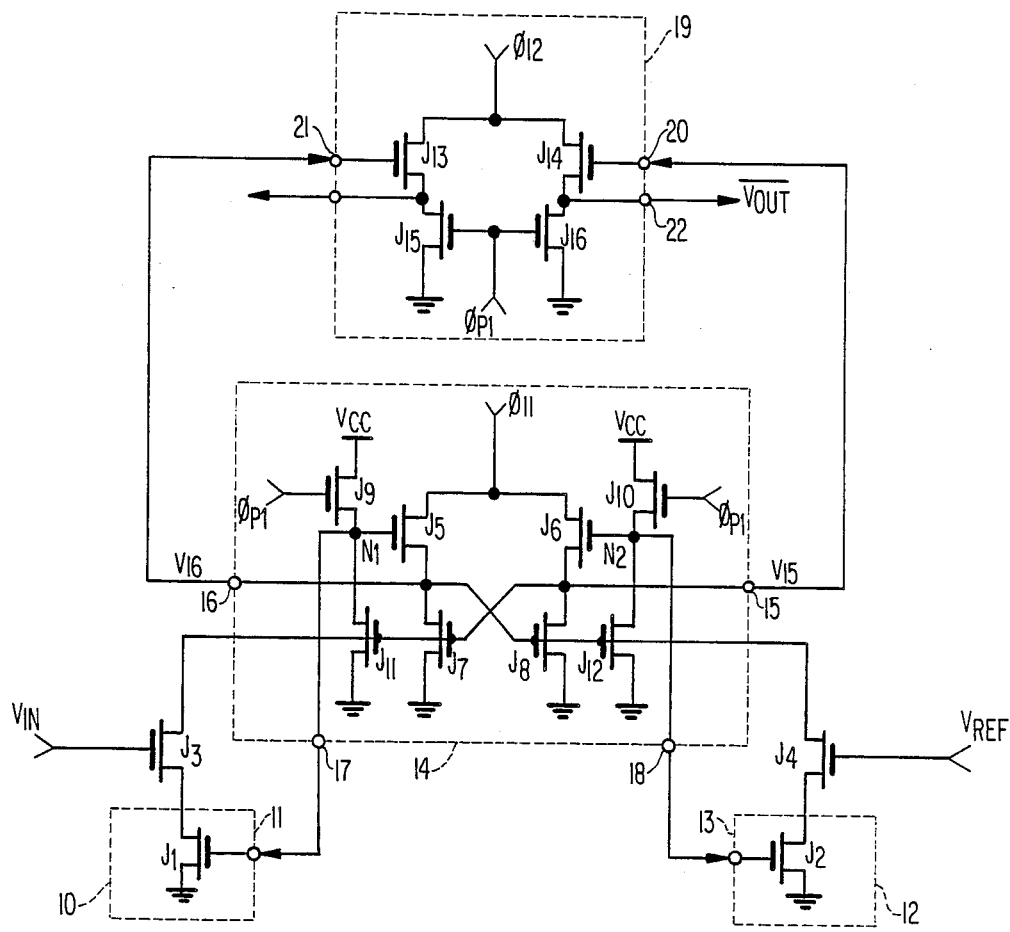
FIG. 5 is a circuit diagram showing another embodiment of the present invention.

FIG. 5 shows another embodiment of the present invention, in which the same constituents as those in FIG. 3 are represented by the same references to omit their further description. In this embodiment, the first gate 10 is inserted between the transistor $J_3$ and the ground terminal and the second gate 12 is inserted between the transistor $J_3$ and the ground. Therefore, the same effects as those in FIG. 3 are also obtained in this embodiment.

Figure 6:
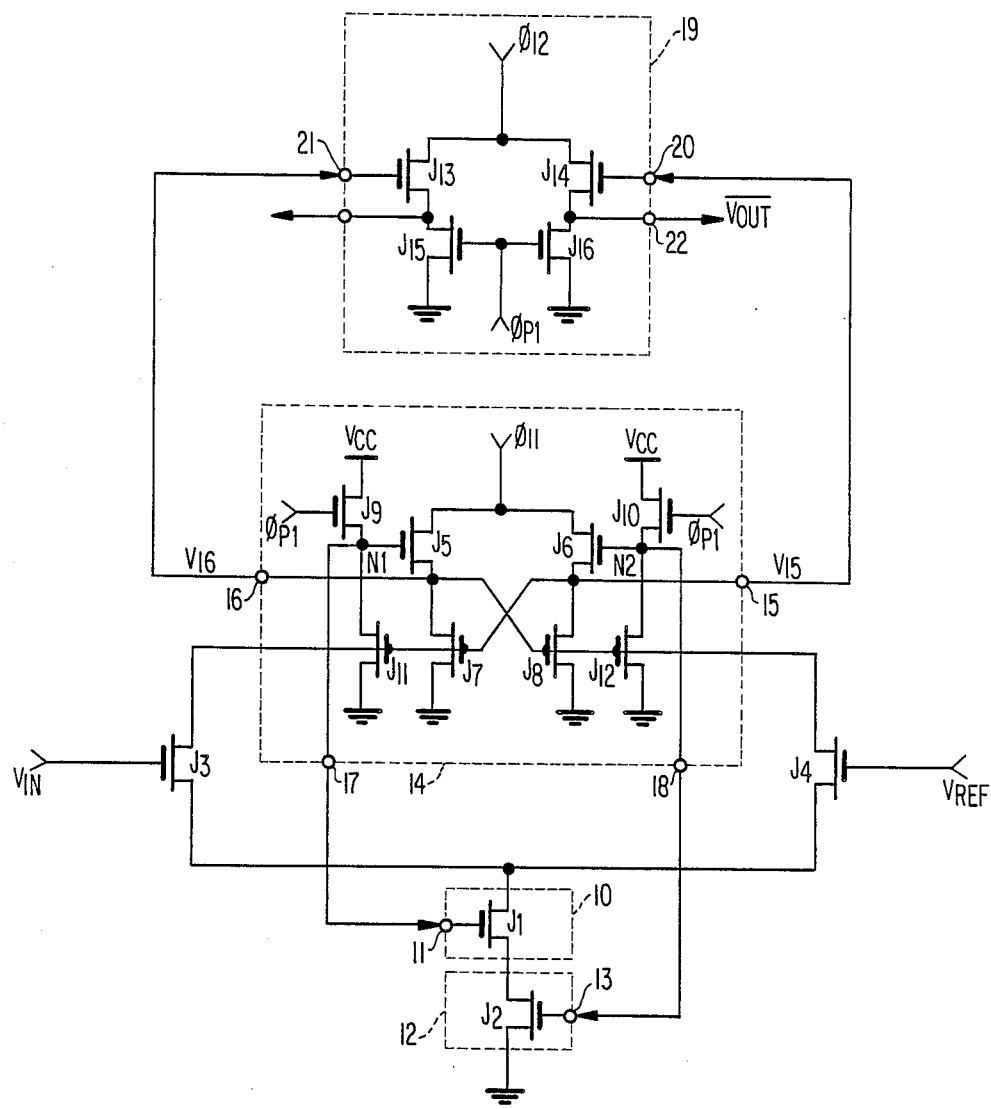
FIG. 6 is a circuit diagram showing still another embodiment of the present invention.

FIG. 6 shows still another embodiment. In this embodiment, on of the source and drain of the transistor $J_3$ is connected in common to one of the source and drain of the transistor $J_4$, and the common connection point is connected to the ground via a series circuit of the first and second gates 10 and 12. Other circuit constructions are the same as FIG. 3. In this embodiment, when one of the gates 10 and 20 is closed, both of the input signal voltage $V_{IN}$ and the reference voltage $V_{ref}$ are disconnected from the flip-flop circuit 14.

The present invention is not limited to the above embodiments, by may be modified are change without departing from the scope and spirit of the present invention.

What is claimed is:

1. A signal input circuit comprising a flip-flop circuit having first, second, third and fourth terminals, a first transistor supplied with an input signal voltage, a second transistor supplied with a reference voltage, a first gate having a control terminal connected to said third terminal of said flip-flop circuit, a second gate having a control terminal connected to said fourth terminal of said flip-flop circuit, a reference terminal, means for connecting said first transistor and said first gate in series between said first terminal of said flip-flop circuit and said reference terminal, means for connecting said second transistor and said second gate in series between said second terminal of said flip-flop circuit and said reference terminal, said flip-flop circuit amplifying a difference in potential between said first and second terminals caused by a difference between said input signal voltage and said reference voltage and thereby producing an enlarged potential difference between said first and second terminals, said flip-flop circuit further producing a first level and a second level at said third and fourth terminals, respectively, when said input signal voltage is larger than said reference voltage and said second level and said first level at said third and fourth terminals, respectively, when said input signal voltage is smaller than said reference voltage, each of said first and second gates taking an open state by said first level and a closed state by said second level, and means coupled to said first and second terminals of said flip-flop circuit and responsive to said enlarged potential difference for producing an output signal.

2. A transistor circuit comprising an activating terminal supplied with an activating signal, a reference terminal, first and second transistors connected in series between said activating terminal and said reference terminal, third and fourth transistors connected in series between said activating terminal and said reference terminal, first and second nodes, a fifth transistor connected between said first node and said reference terminal, a sixth transistor connected between said second node and said reference terminal, a first terminal connected to a connection point of said third and fourth transistors and control electrodes of said second and fifth transistors, a second terminal connected to a connection point of said first and second transistors and control electrodes of said fourth and sixth transistors, seventh and eighth transistors connected in series between said first terminal and said reference terminal, ninth and tenth transistors connected in series between said second terminal and said reference terminal, means for connecting said first node to a control electrode of said first transistor, means for connecting said second node to a control electrode of said third transistor, means for precharging said first and second nodes before said activating signal is supplied to said activating terminal, means for supplying a first voltage to a control electrode of said seventh transistor, means for supplying a second voltage to a control electrode of said ninth transistor, means for connecting said first node to a control electrode of said eighth transistor, and means for connecting said second node to a control electrode of said tenth transistor.

3. The circuit as claimed in claim 2, wherein said eighth transistor is connected between said first terminal and said seventh transistor and said tenth transistor is connected between said second terminal and said ninth transistor.

4. The circuit as claimed in claim 2, wherein said eighth transistor is connected between said seventh transistor and said reference terminal and said tenth transistor is connected between said ninth transistor and said reference terminal.

5. The circuit as claimed in claim 2, further comprising a third node, said seventh transistor being connected between said first terminal and said third node, said ninth transistor being connected between said second terminal and said third node, said eighth and tenth transistors being connected in series between said third node and said reference terminal.

* * * * *

UNITED STATES PATENT AND TRADEMARK OFFICE
CERTIFICATE OF CORRECTION

PATENT NO. : 4,785,206

DATED : November 15, 1988

INVENTOR(S) : Hoshi

It is certified that error appears in the above-identified patent and that said Letters Patent is hereby corrected as shown below:

Column 4, line 35, delete "terminal 16" and insert --terminal 15--; Page 10, line 7.

Column 5, line 67, delete "change" and insert --changes--. Page 14, line 6

Column 6, line 7, "changes" should be --change--.

Signed and Sealed this

Tenth Day of July, 1990

*Attest:*

HARRY F. MANBECK, JR.

*Attesting Officer*     *Commissioner of Patents and Trademarks*